Sept. 4, 1973 HISASHI MURAOKA ET AL 3,756,877

METHOD FOR MANUFACTURING A SEMICONDUCTOR INTEGRATED CIRCUIT ISOLATED BY DIELECTRIC MATERIAL

Filed Oct. 4, 1971 7 Sheets-Sheet 6

3,756,877

METHOD FOR MANUFACTURING A SEMICONDUCTOR INTEGRATED CIRCUIT ISOLATED BY DIELECTRIC MATERIAL

Hisashi Muraoka, Yokohama, Taizo Ohashi, Kanagawa, and Toshiko Yasui, Kawasaki, Japan, assignors to Tokyo Shibaura Electric Co., Ltd., Kawasaki-shi, Japan Filed Oct. 4, 1971, Ser. No. 186,257
Claims priority, application Japan, Oct. 5, 1970, 45/86,586; July 6, 1971, 46/49,250
Int. Cl. H01l *7/50*
U.S. Cl. 156—17 11 Claims

ABSTRACT OF THE DISCLOSURE

A method for manufacturing an integrated circuit isolated by dielectric material comprising the steps of carrying out the selective epitaxial growth of island regions on the upper surface of a silicon substrate, coating said island regions and the upper surface of the substrate with an insulating film, forming a silicon layer on said insulating film and etching the silicon substrate with an etchant comprising HF, $HNO_3$ and $CH_3COOH$ and a decomposing or oxidizing agent which can selectively etch the silicon substrate without etching said island regions.

This invention relates to a method for manufacturing a semiconductor integrated circuit isolated by dielectric material whose island regions are electrically insulated by a dielectric film.

There is already known an integrated circuit of the type where island regions formed in a semiconductor body are electrically isolated from each other by a layer of dielectric material such as silicon dioxide. This type of integrated circuit has its insulation capacitance reduced to less than about one-tenth of that associated with a junction isolated circuit, and displays, as is well known, excellent frequency characteristics. On the other hand, said circuit has the drawback that its manufacturing process is considerably complicated with resultant decreased yield. The main reason is that when a semiconductor substrate having island regions formed thereon is lapped and polished. the respective thicknesses of said island regions are diffcult to control.

The object of this invention is to provide a method for manufacturing in good yield a semiconductor integrated device having smooth and flat surfaced island regions electrically insulated from each other by a dielectric film.

The method of this invention consists in etching a high impurity semiconductor substrate on which there are epitaxially grown island regions having low impurity concentrations at least in those portions abutting on said substrate, using a prescribed etchant consisting of HF, $HNO_3$ and $CH_3COOH$ without subjecting these island regions to unnecessary etching. The etchant further includes a decomposing or oxidizing agent to decompose or oxidize nitrous acid generated in the etchant during the etching process so as to prevent the low concentration region from being excessively etched as the process advances. This process enables said island regions to remain intact even during the etching of the substrate, that is, to maintain the prescribed width and surface smoothness with which the island regions were originally formed by epitaxial growth.

The present invention can be more fully understood from the following detailed description when taken in conjunction with reference to the appended drawings, in which.

The present inventors first conducted studies and experiments in connection with the etching of a semiconductor element and as a result have found that semiconductor elements having different impurity concentrations are etched at prominently varying rates according to the kinds and compositions of the etchants used.

Figure 1:
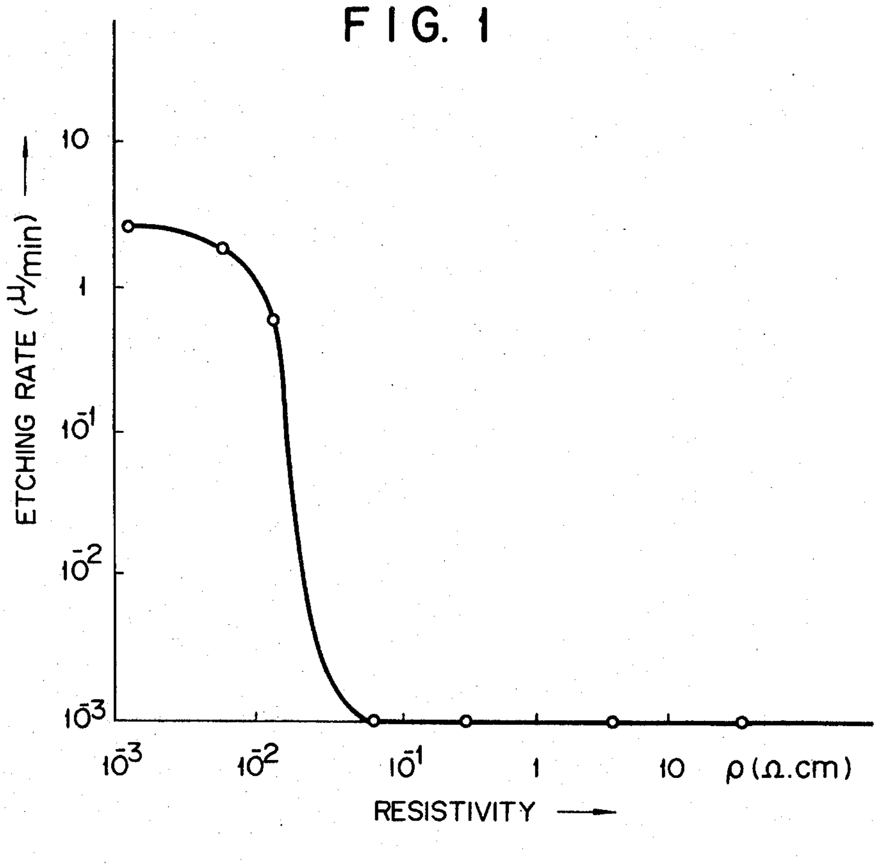
FIG. 1 is a curve diagram of the properties of an etchant used in the manufacturing process of this invention, showing the relationship of the etching rate of said etchant and the resistivity of a silicon substrate.

There will now be described by reference to the appended drawings the developments and results of said experiments. A known etchant having a ternary system of HF—$HNO_3$—$CH_3COOH$ used in etching a silicon element exhibits an etching rate independent of the resistivity, conductivity type and crystallographic orientation of said silicon element, when the three components are mixed in the generally accepted ratio. However, when the acetic acid ($CH_3COOH$) component of said ternary etchant acting as a decelerating agent was used in increased proportions, the etching rate of the resultant etchant was found to be prominently affected by the resistivity of a silicon element, though it remained unaffected by the conductivity type and crystallographic orientation of said element. For example, a ratio between etching rates of high resistivity and low resistivity becomes more than 100. As shown in FIG. 1, an etchant consisting of three components of HF, $HNO_3$ and $CH_3COOH$ mixed in the volume ratio of, for example, 1:3:8 exhibited an etching rate of 0.7 to 3 $\mu$/min. where a silicon element had a resistivity of less than $1.5 \times 10^{-2}$ Ω·cm., whereas the etchant failed to perform etching at all, in case the silicon resistivity was higher than $6.8 \times 10^{-2}$ Ω·cm. Referring to FIG. 1, the etching rate was too minute to determine, where the resistivity was higher than $6.8 \times 10^{-2}$ Ω·cm., so that such rate was taken to be zero.

The foregoing results relate to the case where silicon elements of high and low resistivity were separately etched so as to accurately determine the etching rate. The reason for this separate etching is that where both types of silicon elements were jointly etched by the same etchant, the strong oxidizing action of nitrous acid ($HNO_2$) derived from the etching of the low resistivity silicon allowed the high resistivity silicon to be slightly etched. Determination was made of the rates at which there were jointly etched silicon elements of high and low resistivity or impurity concentration, the results expressed in $\mu$/min. being presented in Table 1 below.

TABLE 1

| $\rho$ p₂ (Ω·cm.) | $\rho$ p₁ (Ω·cm). 0.068 | | 0.30 | | 3.2 | | 25 | |
|---|---|---|---|---|---|---|---|---|
| 0.0012 | 2.73 | 0.014 | 2.79 | 0.017 | 2.74 | 0.025 | 2.74 | 0.015 |
| 0.0058 | 1.10 | 0.025 | 1.28 | 0.018 | 1.30 | 0.006 | 1.75 | 0.011 |
| 0.010 | 0.79 | 0.011 | 0.73 | 0.002 | 0.80 | 0.004 | 0.79 | 0.006 |

Arsenic (As), antimony (Sb), phosphorus (P) end boron (B) used as impurities in the aforementioned experiments indicated the same resutls as shown in Table 1 above.

Table 2 below shows the results of determining the effects of the conductivity type and crystallographic orientation of a crystallized silicon substrate on the etching rate. As seen from this table, the etchant of this invention had its etching rate little affected by the conductivity type and crystallographic orientation of the substrate.

TABLE 2

| | Crystallographic type of silicon | | | |
|---|---|---|---|---|
| ρ (Ω·cm.) | N(100) | N(111) | P(100) | P(111) |
| 0.001 to 0.002 | 2.5 | 2.3 | | |
| 0.006 to 0.008 | 1.9 | | | |
| 0.009 to 0.01 | 1.6 | | | 1.6 |
| 0.01 to 0.015 | 0.62 | 0.75 | | |
| 0.2 to 0.5 | | 0 | 0 | |
| 2 to 5 | | 0 | 0 | |
| 25 to 50 | | | | 0 |

The reason for the above results is assumed to originate with the following fact.

The dissolution of silicon by etchant of $$HF—HNO_2—CH_3COOH$$

is supposed to proceed through the following two-step reaction.

$$Si+2(O)\rightarrow SiO_2 \qquad (1)$$

$$SiO_2+6HF\rightarrow SiF_6^{-2}+2H_2O+2H^+ \qquad (2)$$

Further, determination was made of the rates at which silicon elements of high and low resistivity were jointly etched with the temperature of an etchant varied, thereby defining "arrhenius" Energy of Activation.

(a) N type (100), 0.002 Ω·cm. 5.15 Kcal./mol
(b) N type (100), 5.0 Ω·cm., 12.3 Kcal./mol The value (a) above represents the reaction Formula 2, that is, the case where oxidation process is rate determining. The value (b) denotes the reaction Formula 1, that is, the case where the diffusion process of HF is rate determining. With a high resistivity silicon element, oxidation is a rate determining factor with the resultant slow etching rate, and with a low resistivity silicon element, the diffusion of HF is a rate determining factor to permit quick etching.

Figure 2:
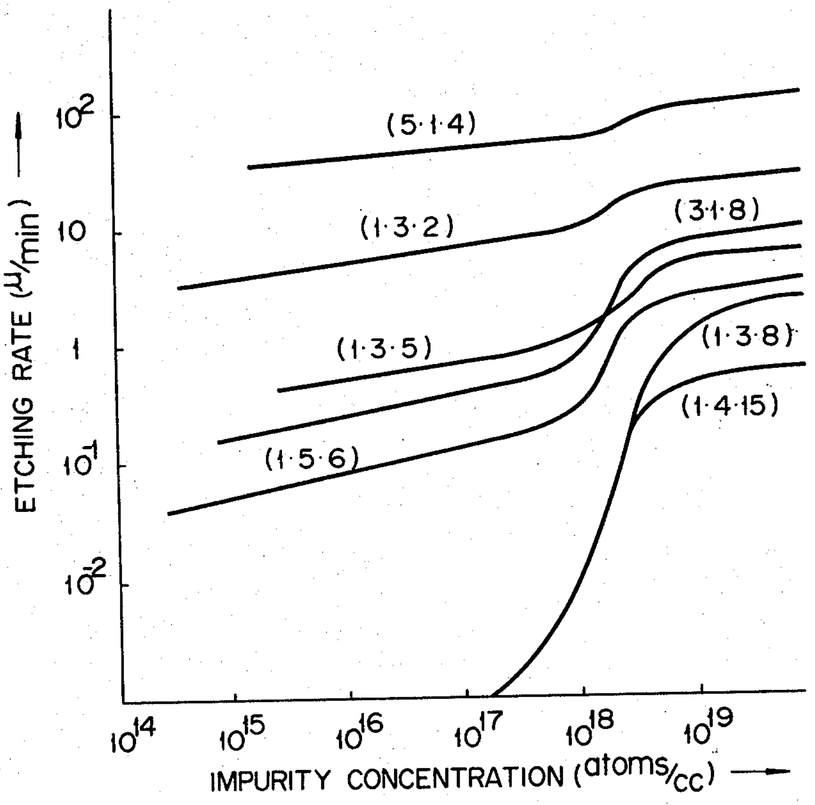
FIG. 2 is a curve diagram of the relationship of the etching rate of an etchant consisting of hydrogen fluoride (HF), nitric acid ($HNO_3$) and acetic acid ($CH_3COOH$) and the resistivity of a silicon substrate, where the proportions of these components were varied.

The foregoing results of determination were obtained with an etchant consisting of three components of HF, $HNO_3$ and $CH_3COOH$ which were compounded in the ratio of 1:3:8. When its composition is varied, an etchant of such a ternary system exhibits, as shown in FIG. 2, prominently different etching rates with respect to silicon elements having high and low impurity concentrations. In FIG. 2, the different impurity concentrations of silicon elements are plotted on the abscissa and the etching rates on the ordinate, where said silicon elements were etched by etchants of a ternary system whose components were mixed in varying proportions. FIG. 2 shows that regardless of its composition, said ternary system etchant generally presented a sharp increase in the etching rate when the impurity concentration of a silicon element approached $10^{18}$ to $10^{19}$ atoms/cm.$^3$, and that the extent of said increase was considerably varied according to the composition of the etchant actually used. The etching rate of a ternary system etchant consisting of HF, $HNO_3$ and $CH_3COOH$ compounded in the ratio of, for example, 1:3:8 (denoted by the (1·3·8) curve) indicated a sudden rise at the aforesaid impurity concentration of $10^{18}$ to $10^{19}$ atoms/cm.$^3$, but presented no noticeable increase at higher impurity concentrations. In contrast, etchants having ternary compositions whose components were mixed in the ratios of 5:1:4 and 1:3:2 (represented by the (5·1·4) and (1·3·2) curves respectively) showed little variation in the etching rate at the abovementioned impurity concentration.

Figure 3:
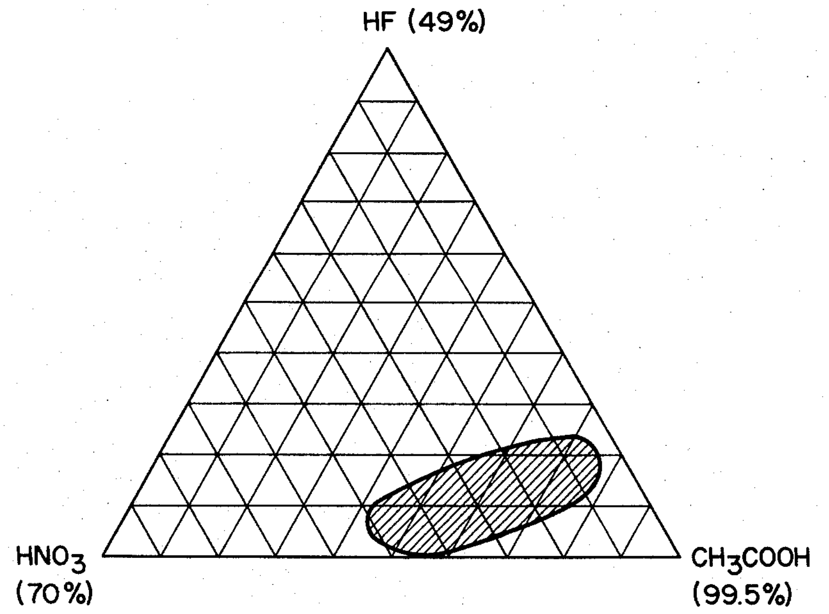
FIG. 3 is a triangular chart showing the preferred proportions of the three components of HF, $HNO_3$ and $CH_3COOH$ constituting the etchant used in the manufacturing process of this invention.

As mentioned above, an etchant comprising a ternary system of $HF—HNO_3—CH_3COOH$ in which $CH_3COOH$ has a prominently large proportion presents different etching rates with respect to jointly used silicon elements of high and low impurity concentrations. The etching rate for a silicon element of high impurity concentration is practically preferred to be over ten times quicker than that for a silicon element of low impurity concentration. If the difference between said etching rates falls to below said ratio, the object of this invention will not be fully attained. It has been experimentally found that the ternary composition of an etchant capable of realizing the preferred etching rate ratio should fall within the hatched region of FIG. 3. The preferred range of the ternary composition represented by said hatched region was determined by simultaneously etching an N type silicon element of (100) crystallographic orientation having a resistivity of 0.008 Ω·cm. and that having a restitivity of 5 Ω·cm. with the same etchant. Main ratios of HF, $HNO_3$ and $CH_3COOH$ in said hatched region are 5:50:45, 20:20:60, 25:8:67, 15:5:80, 5:20:75 and 2:40:58.

When determination was made of the etching rate of the aforementioned etchant whose ternary composition had a ratio of 1:3:8, said etching rate was found to be as small as 0.025 μ/min. with respect to a layer of silicon oxide. This etching rate only accounts for about 1/30 to 1/100 of that for a low resistivity silicon element. It will be apparent, therefore, that the etchant of this invention only dissolves a low resistivity silicon element, but does not substantially etch a high resistivity silicon element and an insulating layer made of, for example, silicon oxide, silicon nitride and aluminium oxide. Three components of HF, $HNO_3$ and $CH_3COOH$ in the etchant used in the present invention are respectively solutions of 49, 70 and 99.5%.

The above-mentioned etching process is indeed very effective, where etching is completed in a short time, but is accompanied with the undermentioned drawbacks, where etching is conducted for a long time.

Long etching tends to generate in the etchant large amounts of compounds thereof such as NO, $NO_2$ and $HNO_2$. When there is used an etching solution containing such materials, a silicon epitaxial region containing low concentrations of impurities is subjected to vigorous oxidation by the aforesaid nitrous acid and rapidly etched due to the resulting shifting of the rate determining step.

At this time, the oxidation reaction is believed to proceed in the following manner. Oxidation of silicon by $HNO_3$ expressed by the aforementioned Formula 1 proceeds while generating nitrous acid as an intermediate product. Said nitrous acid is a more active oxidizing agent than nitric acid. Therefore, the evolution of the nitrous acid gives rise to the following reaction:

$$4HNO_2+Si\rightarrow SiO_2+2H_2O+4NO \qquad (3)$$

Further, the nitrous acid itself plays the role of a catalyst and increases its own amount as seen from the following two steps of reaction:

$$HNO_2+HNO_3\rightarrow N_2O_4+H_2O \text{ (slow)} \qquad (4)$$

$$N_2O_4+2NO+2H_2O\rightarrow 4HNO_2 \text{ (fast)} \qquad (5)$$

Apart from the Formulas 4 and 5 above, NO derived from the Formula 3 produces additional nitrous acid by the following reaction:

$$HNO_3+NO\rightarrow HNO_2+NO_2 \qquad (6)$$

The Formulas 3 to 6 suggest that long etching increases the amount of nitrous acid. Since the aforementioned type of etching solution is only effective when etching lasts for a short time, it has to be replaced with a fresh one at a prescribed interval, for example, of 5 to 10 minutes where etching is conducted long. Therefore, the etching process of the prior art using such etchant has the drawback that it requires large amounts of etchant and is difficult to control.

The object of this invention, therefore, is to eliminate such difficulties. This object is attained by adding an oxidizing or decomposing agent to the etching solution of the aforesaid type so as to convert nitrous acid by oxidation or decomposition to nitric acid or nitrogen respectively.

There will now be described the results of experiments conducted on the oxidation of nitrous acid. There were jointly etched a silicon wafer having a low resistivity of about 0.002 Ω·cm. and another having a high resistivity of about 5 Ω·cm. in 100 ml. of an etching solution consisting of HF, $HNO_3$ and $CH_3COOH$ compounded in the volume ratio of 1:3:8, and also in a solution obtained by adding hydrogen peroxide as an oxidizing agent to said etching solution stepwise in increments of 0.05 ml. per 30 seconds. The relationship of the etching time and the etched thickness is presented in FIG. 4, in which the solid lines represent the case where there was used said etching solution alone and the broken lines the case where said solution was mixed with the oxidizing agent of hydrogen peroxide. Further, a cross mark X denotes the case of a high resistivity silicon wafer of about 5 Ω·cm. of the case of a low resistivity silicon wafer of less than 0.002 Ω·cm., and Δ the amount of nitrous acid present in the etching solution free of hydrogen peroxide. This amount of nitrous acid was determined by the well known reduction-oxidation (redox) titration with potassium permanganate ($KMnO_4$). As seen from FIG. 4, long etching generally increased the amount of nitrous acid ($HNO_2$). In this case, the low resistivity silicon wafer was etched at a relatively constant rate, while the high resistivity wafer rapidly etched. For illustration, when etching was conducted 2 minutes, the etching rate of the high resistivity wafer indicated a ratio $1/160$ to that of the low resistivity silicon wafer, whereas when etching lasted 15 minutes, the etching rate of the former presented a ratio of $1/6.7$ to that of the latter. In contrast, where the etchant solution contained hydrogen peroxide, the low resistivity silicon wafer was increasingly etched during long etching substantially in the same way as when there was not added the hydrogen peroxide, whereas the etching rate of the high resistivity silicon was fixed at a very low level regardless of the etching time. For example, even after etching of 15 minutes, the etching rate of the high resistivity silicon wafer was as small as $1/6800$ of that of the low resistivity silicon wafer and equal to about $1/40$ of that extent to which the former was etched where etching was carried out 2 minutes using an etchant free of hydrogen peroxide.

Figure 4:
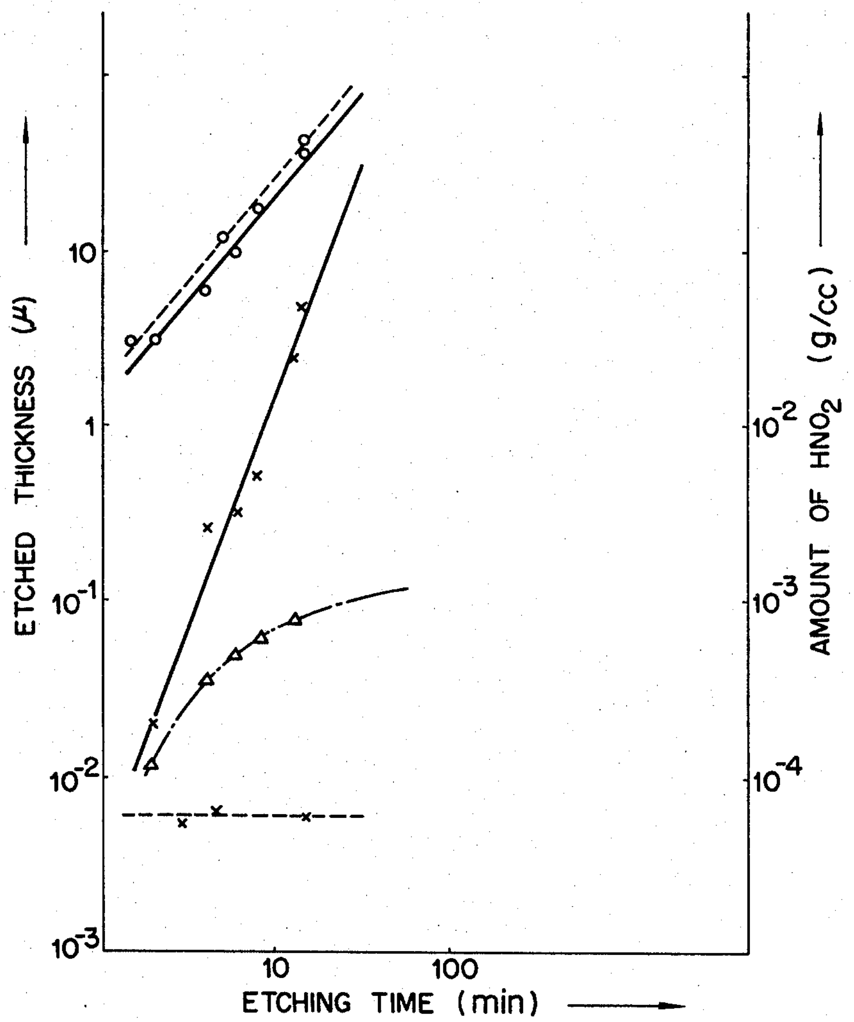
FIG. 4 is a curve diagram of the relationship of the etched thickness of the semiconductor substrate and the etching time in the case of using an etchant including an oxidizing agent.
Figure 5:
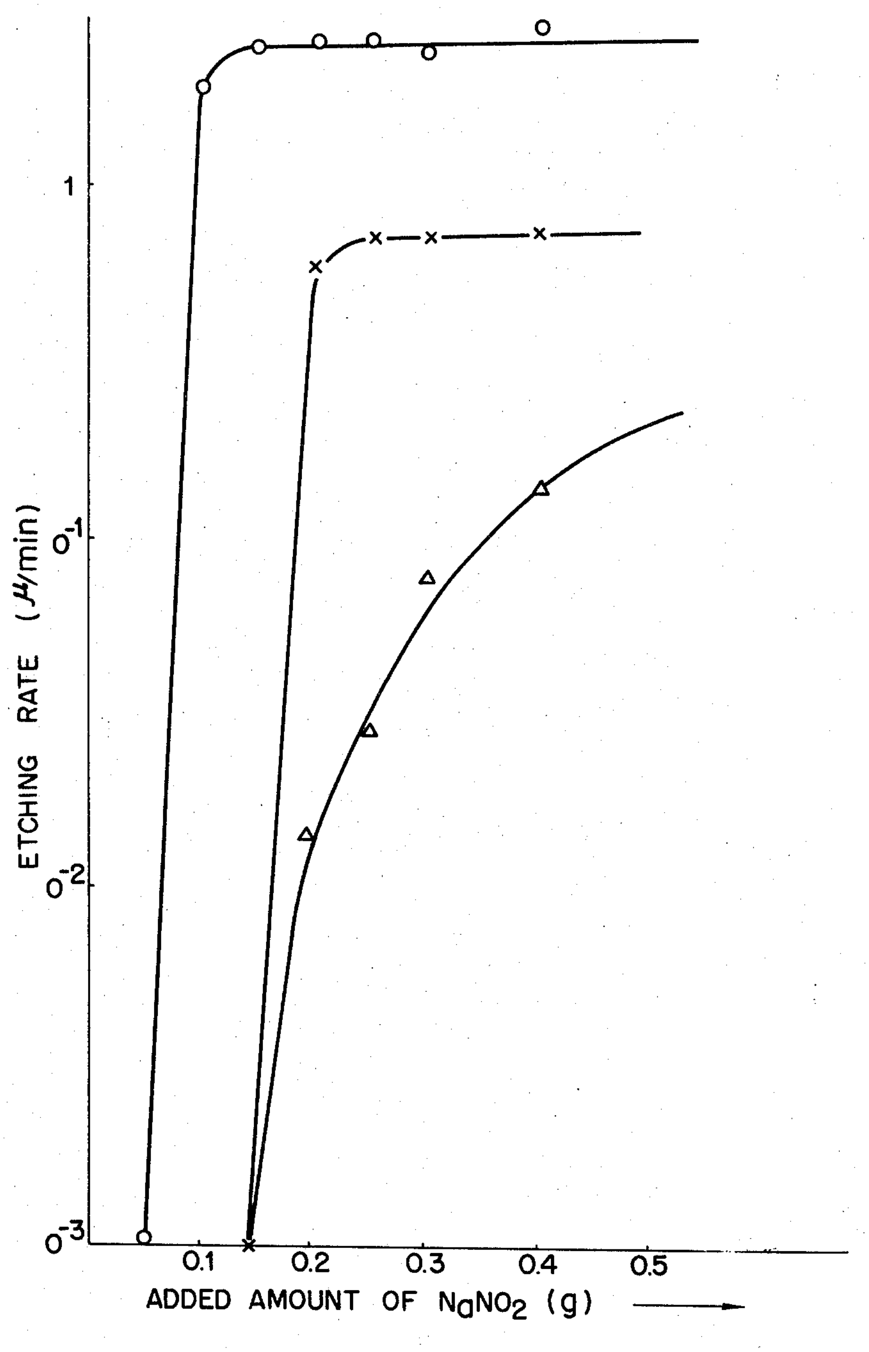
FIG. 5 is a curve diagram of the relationship between the etching rate and the added amount of $NaNO_2$.

FIG. 5 shows the varying etching rate of silicon wafers having different degrees of resistivity which were etched in a solution prepared by adding first 0.2 ml. of 31% hydrogen peroxide and then sodium nitrite ($NaNO_2$) in small increments to 100 ml, of an etching solution having the same composition as that previous described by reference to FIG. 4. Referring to FIG. 5, a mark *o* represents a low resistivity N type silicon wafer of about 0.002 Ω·cm. with the (111) face as a main surface, X a low resistivity N type silicon wafer of 0.015 Ω·cm. with the (100) face as a main surface and Δ a high resistivity N type silicon wafer of 6 Ω·cm. with the (100) face as a main surface. As is apparent from FIG. 5, the low resistivity silicon wafers which were not etched at all when there was purposely added 0.05 g. of sodium nitrite ($NaNO_2$) having the same action as nitrous acid, were etched at the rate of 2 μ/min. when the content of $NaNO_2$ was increased to 0.1 g. Thereafter any increased amount of $NaNO_2$ did not appreciably vary said etching rate. In contrast, the higher the resistivity of the wafers tested, the more delayed the starting time of etching, requiring at least 0.2 g. of $NaNO_2$ for the quick initiation of etching. If, therefore, the ratio of $H_2O_2$ to the etchant solution is chosen to fall within the range where the low resistivity alone is etched but not that of high resistivity namely, the range where 0.2 ml. of $H_2O_2$ can eliminate 0.1 to 0.2 g. of $NaNO_2$, then there can be performed desirable selective etching.

As will be understood from the results of experiments shown in FIGS. 4 and 5, addition of $H_2O_2$ controls the generation of nitrous acid ($HNO_2$) in the etching solution. Thus the different rates of etching between high and low concentrations of impurities can be increased about 40 fold (at this time the etching rate of a high resistivity silicon wafer is $1/6800$ of that of a low resistivity silicon wafer) over the case where the etchant does not contain any oxidizing agent. Moreover, the etching rate of the high resistivity silicon wafer can always be maintained at a substantially fixed low level regardless of the etching time.

The foregoing description relates to the case where these was used hydrogen peroxide as an oxidizing agent. For reference, there is presented in Table 3 below the relationship of the added amounts of $KMnO_4$, $K_2Cr_2O_7$ and $(NH_4)_2S_2O_8$ and corresponding etching rates.

TABLE 3

| Oxidizing agent | Amount added (g.) | Etching rate (μ/min.) |
|---|---|---|
| $KMnO_4$ | 0.005 | 2.3 |
| | 0.05 | 0.03 |
| $K_2Cr_2O_7$ | 0.2 | 0.9 |
| | 0.5 | 0.18 |
| $(NH_4)_2S_2O_8$ | 0.25 | 2.2 |
| | 0.5 | 0 |

When there was added 0.005 g. of $KMnO_4$ to 100 ml. of an etching solution consisting of HF, $HNO_3$ and $CH_3COOH$ bearing the ratio of 1:3:8, the resultant etching exhibited the same rate of 2.3μ/min. as when the etching solution did not contain any amount of said $KMnO_4$. When the addition of $KMnO_4$ was increased to 0.05, a low resistivity silicon wafer was etched at the rate of 0.03 μ/min. This suggests that like addition of $H_2O_2$ in FIG. 5, addition of a prescribed amount of $KMnO_4$ can control the generation of nitrous acid, enabling a low resistivity semiconductor alone to be etched. The same holds true with $K_2Cr_2O_7$ and $(NH_4)_2S_2O_8$, though detailed description is omitted. Any other oxidizing agents than those mentioned above may attain the aforesaid good effect when added to the etching solution consisting of an $HF—HNO_3—CH_3COOH$ system, provided said oxidizing agent have a capacity to oxidize nitrous acid. However, $H_2O_2$ is most preferable, because its reaction with nitrous acid only produces $H_2O$ quite harmless to the semiconductor and etching solution. While these oxidizing agents may be added to the etching solution in advance, it is more effective to add them in prescribed increments at a predetermined interval, where etching is to be continued long. If, in this case, the evolution of nitrous acid is continuously determined and the oxidizing agent is added when said evolution reaches the predetermined level, it will be most effective.

The foregoing description relates to the case where there was added an oxidizing agent to an etching solution consisting of a $HF—HNA_3—CH_3COOH$ system. However, addition of a decomposing agent realizes substantially the same result. There will now be described the application of such decomposing agent. Though there may be thought of various decomposing agents to decompose nitrous acid, there is discussed the case where there is used sodium nitride ($NaN_3$). Reaction of $NaN_3$ with said etching solution proceeds as follows:

$$NaN_3+CH_3COOH \rightarrow CH_3COONa+HN_3$$
$$HN_3+HNO_2 \rightarrow N_2+N_2O+H_2O \quad (7)$$

Figure 6:
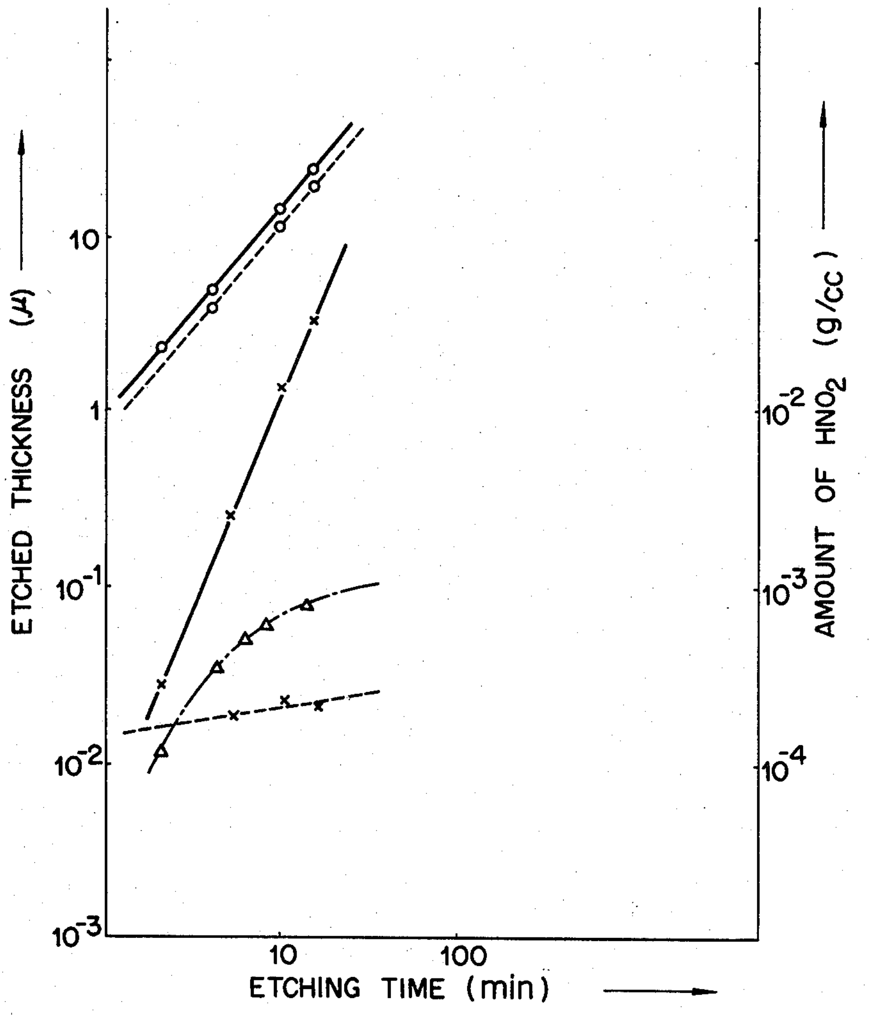
FIG. 6 is a curve diagram of the relationship of the etched thickness of the semiconductor substrate and the etching time in the case of using an etchant including a decomposing agent.

There will be further detailed by reference to FIG. 6 the effect of using said decomposing agent. In FIG. 6, the etching thickness is plotted on the left ordinate, the generation of $HNO_2$ (g./cc.) on the right ordinate and the etching time on the abscissa, showing the resistivity of a low resistivity silicon wafer of about 0.015 Ω·cm. and a high resistivity silicon wafer of about 5 Ω·cm. when etched in 100 ml. of an etching solution consisting of HF, $HNO_3$ and $CH_3COOH$ bearing the volume ratio of 1:3:8 and the resultant different etching rates thereof between the presence and absence of a decomposing agent. In FIG. 6, the solid lines represent the case there was not added a decomposing agent of sodium nitride ($NaN_3$) and the broken lines the case where there was added said decomposing agent stepwise in increments of 0.1 ml. per 30 seconds. Further, a cross mark X denotes a high resistivity silicon wafer of about 5 Ω·cm., O a low resistivity silicon wafer of about 0.015 Ω·cm. and Δ the amount of nitrous acid present in the etching solution free of $NaN_3$ as a decomposing agent. The residual amount of nitrous acid was determined by the redox titration with $KMnO_4$. As seen from FIG. 6, absence of $NaN_3$ causes the amount of $HNO_2$ to increase progressively with the time of etching as indicated by the solid lines. Under this condition, the low resistivity silicon wafer was etched at a fixed rate, whereas the high resistivity silicon wafer was rapidly etched. For illustration, where etching was conducted 2 minutes, the etching rate of the high resistivity silicon wafer was 1/80 of that of the low resistivity silicon wafer. However, when etching was continued 15 minutes, the etching rate of the former was 1/5.2 of that of the latter. In contrast, where the etching solution contained $NaN_3$, the etching rate of the high resistivity silicon wafer was, as indicated by the dotted line, 1/845 of that of the low resistivity silicon wafer even after the etching lasted 15 minutes. The value of 1/845 means that the etching rate of the high resistivity silicon wafer decreased about 11 times the etching rate which was observed in said wafer as compared with that of the low resistivity silicon wafer when etching was conducted 2 minutes using an etching solution free of $NaN_3$.

The results of the aforementioned experiments show that addition of a decomposing agent such as $NaN_3$ to an etching solution can control the evolution of nitrous acid therefrom, thus enabling a high resistivity silicon wafer to be etched at a constate rate.

%fiH

The decomposing agent of nitrous acid ($HNO_2$) is not limited to the aforesaid sodium nitride ($NaN_3$), but may consist of any of, for example, urea, ammonium salts, thiourea, amino sulfonate and hydrazine.

Table 4 below compares the etching rate of a low resistivity silicon wafer of about 0.015 Ω·cm. and that of a high resistivity silicon wafer of about 5 Ω·cm. when they were etched 5 minutes in 100 ml. of an etching solution consisting of HF, $NHO_3$ and $CH_3COOH$ bearing the volume ratio of 1:3:8 with $NaN_3$ and urea $$(CO(NH_2)_2)$$

respectively added as a decomposing agent of nitrous acid ($HNO_2$).

TABLE 4

| Decomposing agent | Resistivity 0.015 Ω·cm. | 5 Ω.cm. |
|---|---|---|
| Absence of a decomposing agent, μ | 6.34 | 0.35 |
| $NaN_3$, μ | 5.80<br>5.23 | 0.096<br>0.019 |
| $CO(NH_2)$, μ | 5.52<br>5.68 | 0.088<br>0.040 |

Reaction of urea used as a decomposing agent with nitrous acid may be expressed by the following formula:

$$CO(NH_2)_2+2HNO_2 \rightarrow 2N_2+CO_2+3H_2O \quad (8)$$

As apparaent from the Formula 8 above the Table 4, urea decomposes nitrous acid into nitrogen gas, which can be easily expelled from the etching solution. However, the reaction of (8) proceeds more slowly than that of (7), requiring large amounts of urea to stoichiometrical value. For practical purpose, therefore, urea is inferior to $NaN_3$. As compared with other decomposing agents, $NaN_3$ decomposes nitrous acid more rapidly to evolve gases of $N_2$ which quickly ceases to be released from the etching solution, thus offering considerable convenience.

Figure 7A:
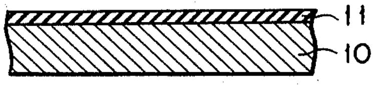
FIGS. 7A and 7G illustrate the sequential steps of an embodiment of the invention.
Figure 7B:
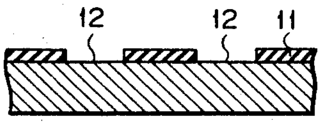
Figure 7C:
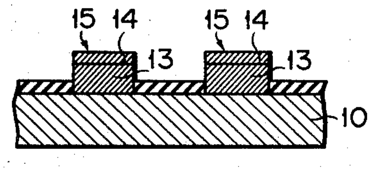
Figure 7D:
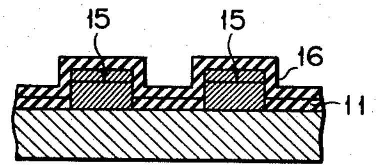
Figure 7E:
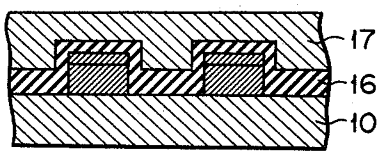
Figure 7F:
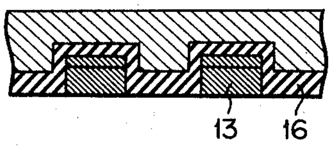
Figure 7G:
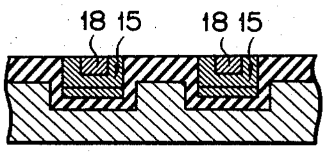

There will now be described by reference to FIGS. 7A to 7G the sequential steps of manufacturing according to an embodiment of this invention a semiconductor integrated circuit in which island regions are electrically isolated by a dielectric element. There is provided, as shown in FIG. 7A, an N type As (Sb, P or B) doped monocrystalline silicon substrate 10 having an impurity concentration of about $1\times10^{19}$ atoms/cm.$^3$. The substrate is polished smooth on one side, where there is coated a film 11 of insulation material such as $SiO_2$ by thermal oxidation or thermally decomposing. The film 11 may be made of $SiN_4$ or $Al_2O_3$ instead of $SiO_2$. The prescribed portions 12 of said insulation film 11 are photoetched, as shown in FIG. 7B, to form island regions thereon later. On the exposed portions of the surface of the substrate 10 are formed by selective epitaxial growth N type regions 13 having a predetermined thickness, on which there are further deposited $N^+$ type regions 14 including large amount of dopant such as As, Sb or P in said N type regions 13, thereby obtaining island regions 15 shown in FIG. 7C. The first portion 13 of the island region 15 which has to be formed with a higher resistivity than the substrate is doped, according to this invention, with Pb or As phosphorus at a concentration of $1\times10^{15}$ atoms/cm.$^3$. On the insulation layer 11 as well as on the island regions 15 are mounted, as shown in FIG. 7D, a film of silicon dioxide by thermal oxidation or thermally decomposing silane. This film 16 may consist of another material such as $Si_3N_4$ or $Al_2O_3$. On said silicon dioxide film 16 is formed, as shown in FIG. 7E a polycrystal layer 17 of silicon. This polycrystal layer 17 of silicon can be prepared by the ordinary vapor growth of silicon. After the aforesaid construction is completed, the silicon substrate 10 is etched off as shown in FIG. 7F. This etching is effected by the aforementioned ternary system etchant consisting of HF, $HNO_3$ and $CH_3COOH$ compounded in the ratio of 1:3:8 and decomposing agent such as $NaN_3$ or oxidizing agent such as $H_2O_2$. This etchant rapidly etches only the high impurity silicon substrate 10 but does not substantially etch the silicon dioxide film 16 and low impurity island regions 13, thereby allowing the surfaces of said film 16 and island regions 13 to remain smooth. After the substrate 10 is etched off, there are formed in the island regions 15 semiconductor elements such as transistors or diodes to complete an integrated circuit. FIG. 7G shows P type regions 18 formed as such elements.

In the present invention, there may be used P-type substrate and an island region formed by epitaxy on said substrate of a suitable dopant such as boron.

The method according to this invention of manufacturing a semiconductor integrated circuit whose island regions are electrically insulated by a dielectric element enables an N type layer constituting an island region to be accurately controlled in thickness. The epitaxial growth of said island region on a semiconductor substrate permits easy control of its thickness, that is, allows it to be formed with any desired thickness. Moreover the island region is little etched, as described above, when the substrate is removed by the aforesaid etchant, so that said island region preserves its original thickness to the last.

According to the aforesaid embodiment, the etchant contained a decomposing or oxidizing agent from the start. Where, however, etching is continued long, it is more effective to add said agent in prescribed amounts at a predetermined interval.

What we claim is:

1. A method for manufacturing an integrated circuit isolated by dielectric material comprising:

(a) a step of preparing a monocrystalline silicon substrate of one conductivity type having a main surface coated with an insulating film of dielectric material the impurity concentration of the substrate being more than $10^{18}$ atoms/cc., (b) a step of partially etching said insulating film and forming an epitaxial growth region of predetermined thickness on the main surface by masking of said etched insulating film, the epitaxial growth region having an impurity concentration less than 1017 atoms/cc., (c) a step of coating said epitaxial growth region with an insulating film and depositing a polycrystalline silicon layer on said insulating films, and (d) a step of etching the silicon substrate with an etchant consisting essentially of HF, $HNO_3$ and $CH_3COOH$ which selectively etches the silicon substrate but does not substantially etch the epitaxial growth region to form an island on the epitaxial growth region isolated from the polycrystalline silicon layer by the insulating film, said etchant further including an agent which eliminates nitrous acid generated in the etchant during the process to keep constant the selectivity of said etchant.

2. A method for manufacturing an integrated circuit isolated by dielectric material according to claim 1 wherein said agent consists of an oxidizing agent to oxidize nitrous acid.

3. A method for manufacturing an integrated circuit isolated by dielectric material according to claim 2 wherein said oxidizing agent is $H_2O_2$.

4. A method for manufacturing an integrated circuit isolated by dielectric material according to claim 3 wherein said agent is added to an etchant in prescribed amounts at a predetermined interval.

5. A method for manufacturing an integrated circuit isolated by dielectric material according to claim 1 wherein said agent consists of a decomposing agent to decompose nitrous acid.

6. A method for manufacturing an integrated circuit isolated by dielectric material according to claim 5 wherein said agent is $NaN_3$.

7. A method for manufacturing an integrated circuit isolated by dielectric material according to claim 6 wherein said agent is added to an etchant in prescribed amounts at a predetermined interval.

8. A method for manufacturing an integrated circuit isolated by dielectric material according to claim 1 wherein said substrate and epitaxially grown region are doped with at least one impurity selected from the group consisting of As, Sb and P to cause the substrate and region to have an N type conductivity.

9. The method of claim 1 wherein the content of HF, $HNO_3$ and $CH_3COOH$ of said etchant is within the shaded area of FIG. 3 of the annexed drawings.

10. In the manufacture of an integrated circuit wherein a monocrystalline silicon substrate is removed by etching from epitaxial growth regions thereon according to claim 1 wherein, as the etching proceeds, adding to the etchant an agent which reduces nitrous acid content thereof.

11. The method of claim 10 wherein said etchant has a composition as defined by the shaded area of FIG. 3 of the annexed drawings and said agent is selected from the group consisting of $H_2O_2$, $KMnO_4$, $K_2Cr_2O_7$, $(NH_4)_2S_2O_8$ $NaN_3$, urea, thiourea, aminosulfonate and hydrazine.

References Cited

UNITED STATES PATENTS 3,461,003 8/1969 Jackson ............ 148—175

OTHER REFERENCES

Slip and Bowing Control by Advanced Etching Techniques, Ch. Wenzel SCP and Solid State Technology, August 1967, pp. 40–44.

JACOB H. STEINBERG, Primary Examiner

U.S. Cl. X.R.

148—175; 317—240